US011792958B2

(12) United States Patent
Yen et al.

(10) Patent No.: US 11,792,958 B2
(45) Date of Patent: Oct. 17, 2023

(54) CONNECTOR ASSEMBLY

(71) Applicant: Molex, LLC, Lisle, IL (US)

(72) Inventors: Sheng-Ping Yen, New Taipei (TW);
Tsai-Hui Chien, New Taipei (TW);
Hui-Hsuan Yang, New Taipei (TW);
Kuan-Lin Peng, New Taipei (TW);
Vinayakumar Kori, Bangalore (IN)

(73) Assignee: Molex, LLC, Lisle, IL (US)

( * ) Notice: Subject to any disclaimer, the term of this patent is extended or adjusted under 35 U.S.C. 154(b) by 111 days.

(21) Appl. No.: 17/474,084

(22) Filed: Sep. 14, 2021

(65) Prior Publication Data
US 2022/0104401 A1   Mar. 31, 2022

(30) Foreign Application Priority Data

Sep. 25, 2020 (CN) .......................... 202011023596.9
Mar. 19, 2021 (CN) .......................... 202110295150.X

(51) Int. Cl.
*H05K 7/20* (2006.01)

(52) U.S. Cl.
CPC ..... *H05K 7/20418* (2013.01); *H05K 7/20472* (2013.01); *H05K 7/205* (2013.01)

(58) Field of Classification Search
CPC ........... H05K 7/20418; H05K 7/20472; H05K 7/205; H01R 13/6581
See application file for complete search history.

(56) References Cited

U.S. PATENT DOCUMENTS

| | | | | |
|---|---|---|---|---|
| 7,601,021 | B1 * | 10/2009 | Yang .................... | G02B 6/4261 439/487 |
| 9,793,648 | B2 * | 10/2017 | Regnier ............... | G02B 6/4201 |
| 9,820,382 | B2 | 11/2017 | Wu et al. | |
| 10,069,248 | B2 * | 9/2018 | Su ........................ | G02B 6/4284 |
| 10,320,113 | B2 | 6/2019 | Khazen et al. | |
| 2003/0161108 | A1 * | 8/2003 | Bright .................. | H05K 9/0058 361/707 |

(Continued)

FOREIGN PATENT DOCUMENTS

| CN | 105988170 A | 10/2016 |
|---|---|---|
| CN | 210015258 U | 2/2020 |

*Primary Examiner* — Emmanuel E Duke

(57) ABSTRACT

The present disclosure provides a connector assembly comprising a cage and a heat sink. The cage has a receiving space and a wall constituting the receiving space, the wall is formed with a window which is communicated with the receiving space and two latching plates which are provided to two sides of the window and extend away from the receiving space, each latching plate is integrally formed with a latching protrusion, the latching protrusion has a guiding portion and a latching portion, a protruding amount of the guiding portion from the latching plate gradually increases as a distance of the guiding portion from the receiving space decreases, the latching portion is positioned to a tip end surface of the guiding portion. The heat sink has a base plate, in a process that the heat sink is assembled to the cage, the base plate pushes against the guiding portions of the latching protrusions of the two latching plates to make the two latching plates elastically move, after the base plate passes over the guiding portions of the latching protrusions of the two latching plates, the latching portions of the latching protrusions of the two latching plates latch with the base plate.

12 Claims, 17 Drawing Sheets

(56) References Cited

U.S. PATENT DOCUMENTS

| | | | |
|---|---|---|---|
| 2007/0183128 A1* | 8/2007 | Pirillis | H05K 9/0058 |
| | | | 361/715 |
| 2014/0153192 A1 | 6/2014 | Neer et al. | |
| 2018/0034211 A1* | 2/2018 | Little | H01R 13/6581 |
| 2020/0244025 A1* | 7/2020 | Winey | H01R 43/26 |

* cited by examiner

CONNECTOR ASSEMBLY

RELATED APPLICATIONS

The present application claims priority to Chinese Patent Application No. 202110295150.X filed on Mar. 19, 2021 and claims priority to Chinese Patent Application No. 202011023596.9 filed on Sep. 25, 2020, all of which are incorporated herein by reference in their entireties.

TECHNICAL FIELD

The present disclosure relates to a connector assembly, and particularly relates to a connector assembly provided with a heat sink.

BACKGROUND

Chinese disclosure patent application issuance publication No. CN104977664B (corresponding to United States utility issuance publication No. U.S. Pat. No. 9,820,382B2) discloses a connector assembly, a connector of the connector assembly is formed with a mounting opening on a bottom shell, a base plate of a heat sink of the connector assembly is mounted on the mounting opening of the bottom shell, an elastic holding member is formed at an edge of the mounting opening of the bottom shell and is used to elastically hold the base plate of the heat sink at the mounting opening, the heat sink can overcome an elastic force of the elastic holding member to move in a prescribed range in a thickness direction of the base plate. However, what is disclosed herein is a configuration which allows the heat sink can elastically move, but such a configuration is not applicable to a connector assembly in which a heat sink does not need to move, and such a configuration disclosed in this patent is complex and is not convenient in assembling and detaching the heat sink.

SUMMARY

Therefore, an object of the present disclosure is to provide a connector assembly which can improve at least one of deficiencies in the prior art.

Accordingly, in some embodiments, a connector assembly of the present disclosure comprising a cage and a heat sink. The cage has a receiving space and a wall constituting the receiving space, the wall is formed with a window which is communicated with the receiving space and two latching plates which are provided to two sides of the window and extend away from the receiving space, each latching plate is integrally formed with a latching protrusion, the latching protrusion has a guiding portion and a latching portion, a protruding amount of the guiding portion from the latching plate gradually increases as a distance of the guiding portion from the receiving space decreases, the latching portion is positioned to a tip end surface of the guiding portion which is close to the receiving space. The heat sink has a base plate and a thermal coupling portion provided to an inner side surface of the base plate which faces the receiving space, in a process that the heat sink is assembled to the cage, the base plate pushes against the guiding portions of the latching protrusions of the two latching plates to make the two latching plates elastically move, after the base plate passes over the guiding portions of the latching protrusions of the two latching plates, the latching portions of the latching protrusions of the two latching plates latch with the base plate, the thermal coupling portion passes through the window and enters into the receiving space.

In some embodiments, the latching portions of the latching protrusions of the two latching plates latch with an outer side surface of the base plate which is opposite to the receiving space, the latching protrusions are elongated bulges which are constructed to outer side surfaces of the two latching plates opposite to each other, a surface of the guiding portion of the latching protrusion is an arc surface, and a protruding amount of the arc surface relative to the latching plate gradually increases.

In some embodiments, the base plate of the heat sink is formed with two grooves which allow the two latching plates to pass through, the latching protrusions of the two latching plates pass through the two grooves respectively so that the latching portions of the two latching protrusions latch with the outer side surface of the base plate.

In some embodiments, the wall of the cage further has auxiliary insertion sheets which are provided alongside each latching plate and inserted into the two grooves.

In some embodiments, the latching portions of the latching protrusions of the two latching plates latch with an outer side surface of the base plate which is opposite to the receiving space, the latching protrusions are elongated bulges which are constructed at inner side surfaces of the two latching plates which face each other, a surface of the guiding portion of the latching protrusion is an arc surface, and a protruding amount of the arc surface relative to the latching plate gradually increases.

In some embodiments, the base plate of the heat sink is formed with two recessed portions corresponding to the two latching plates, the latching protrusions of the two latching plates pass through the two recessed portions respectively, so that the latching portions of the two latching protrusions latch with the outer side surface of the base plate.

In some embodiments, the wall is provided with an elastic tab which presses outwardly and elastically against the inner side surface of the base plate of the heat sink.

In some embodiments, each latching plate is formed with a plurality of airflow holes.

In some embodiments, the base plate is formed with two latching grooves which correspond to the two latching plates respectively, the latching portions of the latching protrusions of the two latching plates latch with the two latching grooves of the base plate respectively, the latching protrusions are elongated protruding sheets constructed at inner sides of the two latching plates which face each other.

In some embodiments, each latching plate further has two lugs integrally formed to two side edges thereof respectively, the two lugs may be bent to enter into the corresponding latching grooves.

In some embodiments, the heat sink is a first heat sink, the connector assembly further comprises a second heat sink and an elastic clip, the second heat sink is assembled on another wall of the cage facing the wall by means of the elastic clip in a manner that the second heat sink can elastically move relative to the receiving space, the second heat sink has a thermal coupling portion entering into the receiving space. Thus both first and second heat sinks can be biased into the receiving space.

In some embodiments, the second heat sink has a base plate which is assembled on the another wall and is provided with the thermal coupling portion, the elastic clip has an elastic pressing portion which elastically presses against the outer side surface of the base plate and an assembling portion which extends from the elastic pressing portion and is assembled to the cage.

The two latching plates of the cage of the present disclosure are integrally provided with the latching protrusions, each latching protrusion includes a guiding portion and a latching portion, a protruding amount of the guiding portion from the latching plate gradually increases as a distance of the guiding portion from the receiving space decreases, therefore, with the guiding portions of the latching protrusions of the two latching plates, the lower heat sink can be guided and smoothly directly pushed in to assemble and latch and fix with the latching portions of the two latching protrusions, and, by that the two latching plates are pushed and pulled, the lower heat sink can be rapidly detached. In addition, by the elastic tab pressing against the lower heat sink, stability of the lower heat sink after the lower heat sink is assembled can be increased, and, a pushing force in a detaching direction can be further provided in detaching the lower heat sink, detaching the lower heat sink is further more convenient and easy. Moreover, the first heat sink and the second heat sink are provided with respect to the receiving space of the cage, heat dissipating efficacy is significantly enhanced.

BRIEF DESCRIPTION OF THE DRAWINGS

Other features and effects of the present disclosure will be apparent in an embodiment referring to the accompanying drawing, in which.

DETAILED DESCRIPTION OF THE PREFERRED EMBODIMENTS

Figure 1:
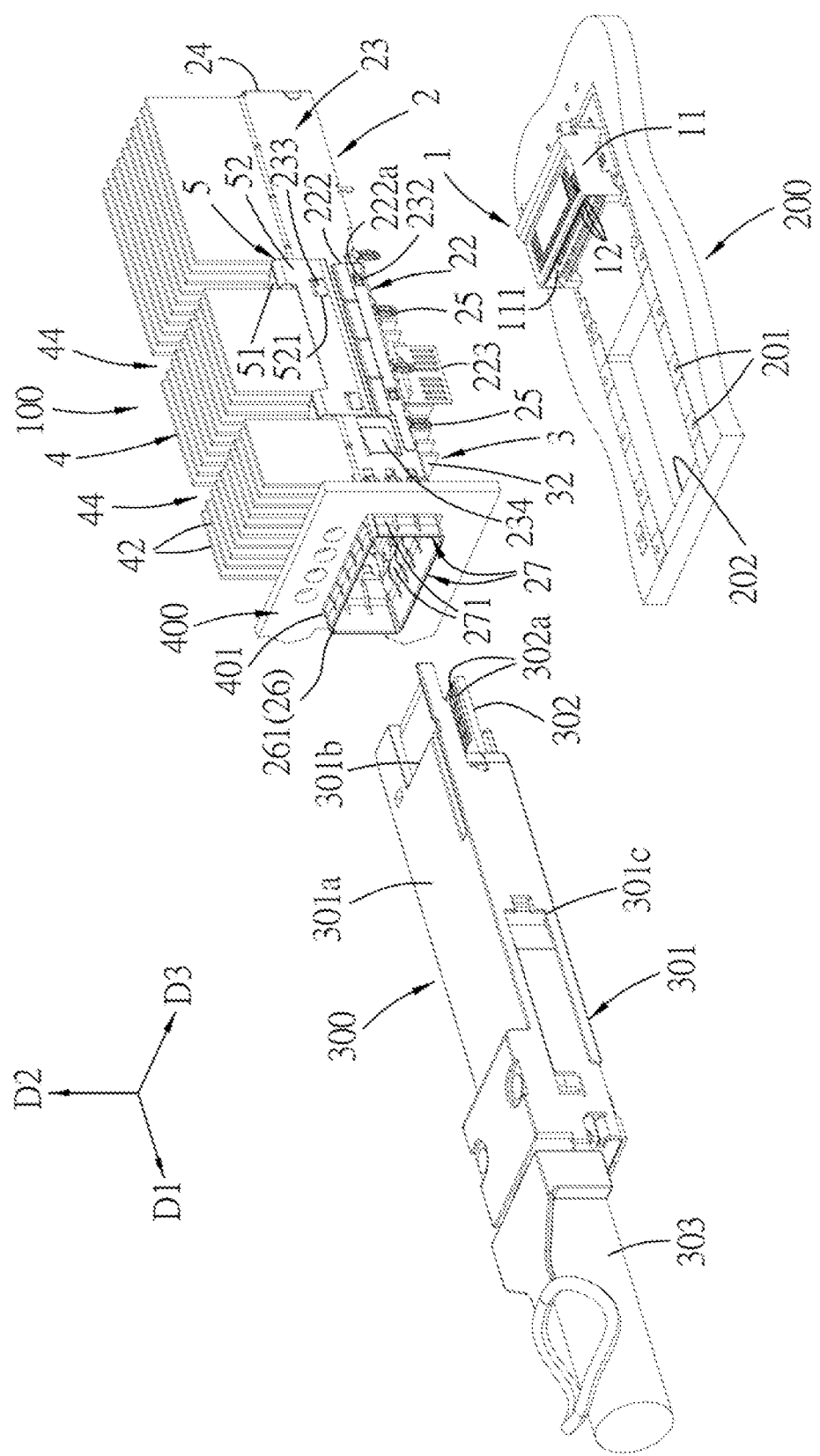
FIG. 1 is a perspective exploded view of a first embodiment of a connector assembly of the present disclosure, a circuit board, a pluggable module and a casing, in which the circuit board and the casing are partially only shown.
Figure 2:
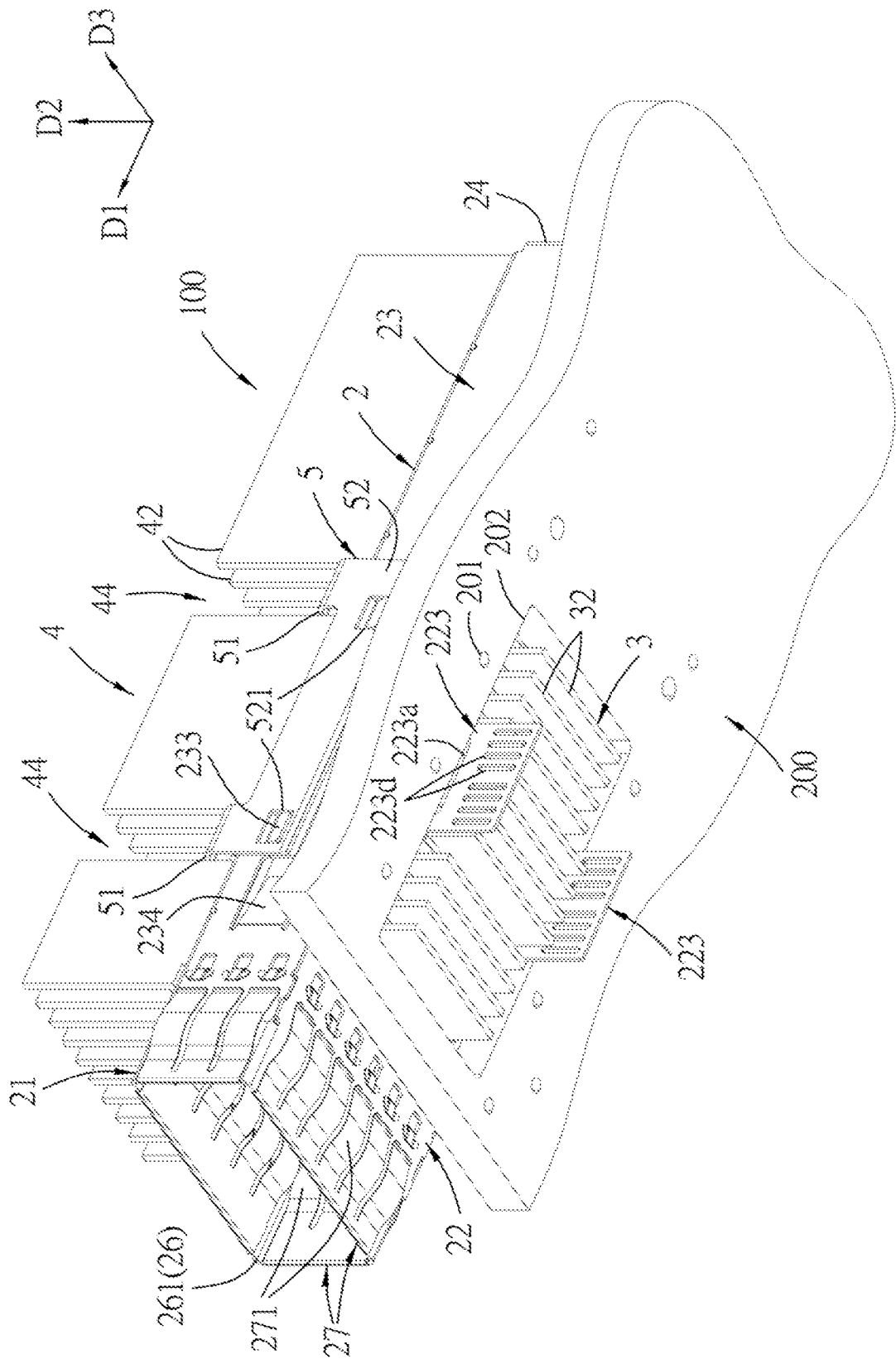
FIG. 2 is a perspective view of the first embodiment provided on the circuit board.
Figure 3:
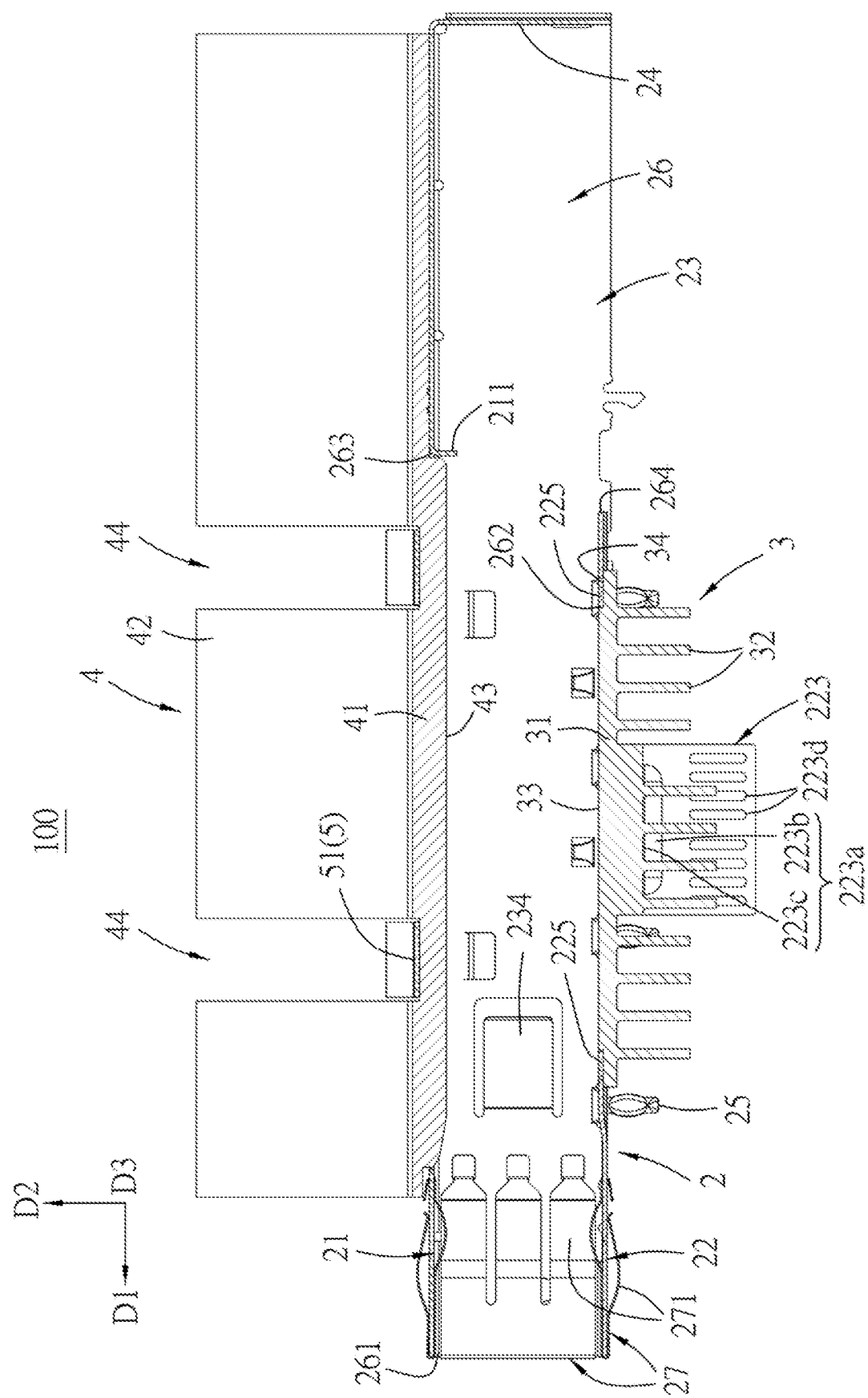
FIG. 3 is a cross sectional view of the first embodiment.
Figure 4:
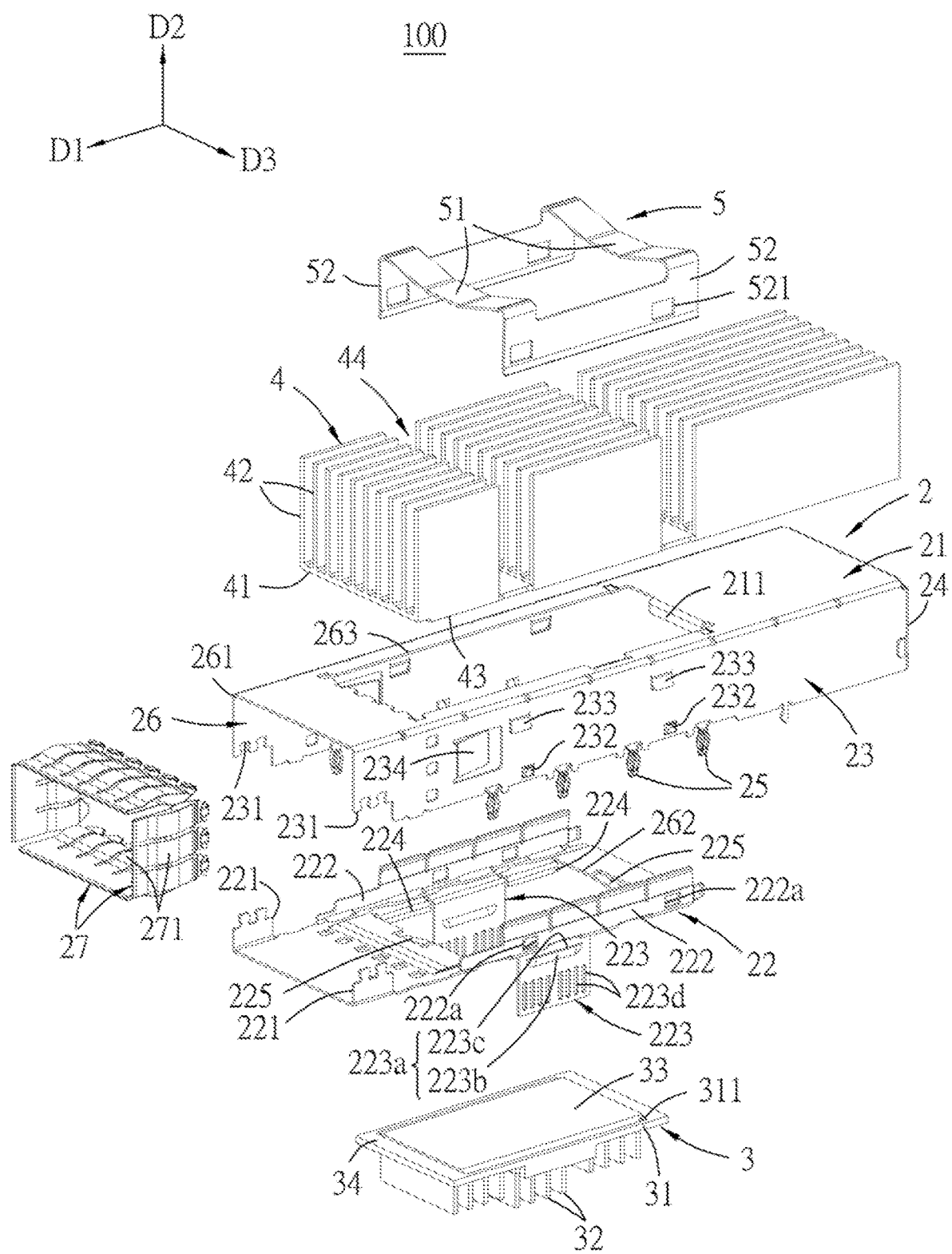
FIG. 4 is a perspective exploded view of the first embodiment.
Figure 5:
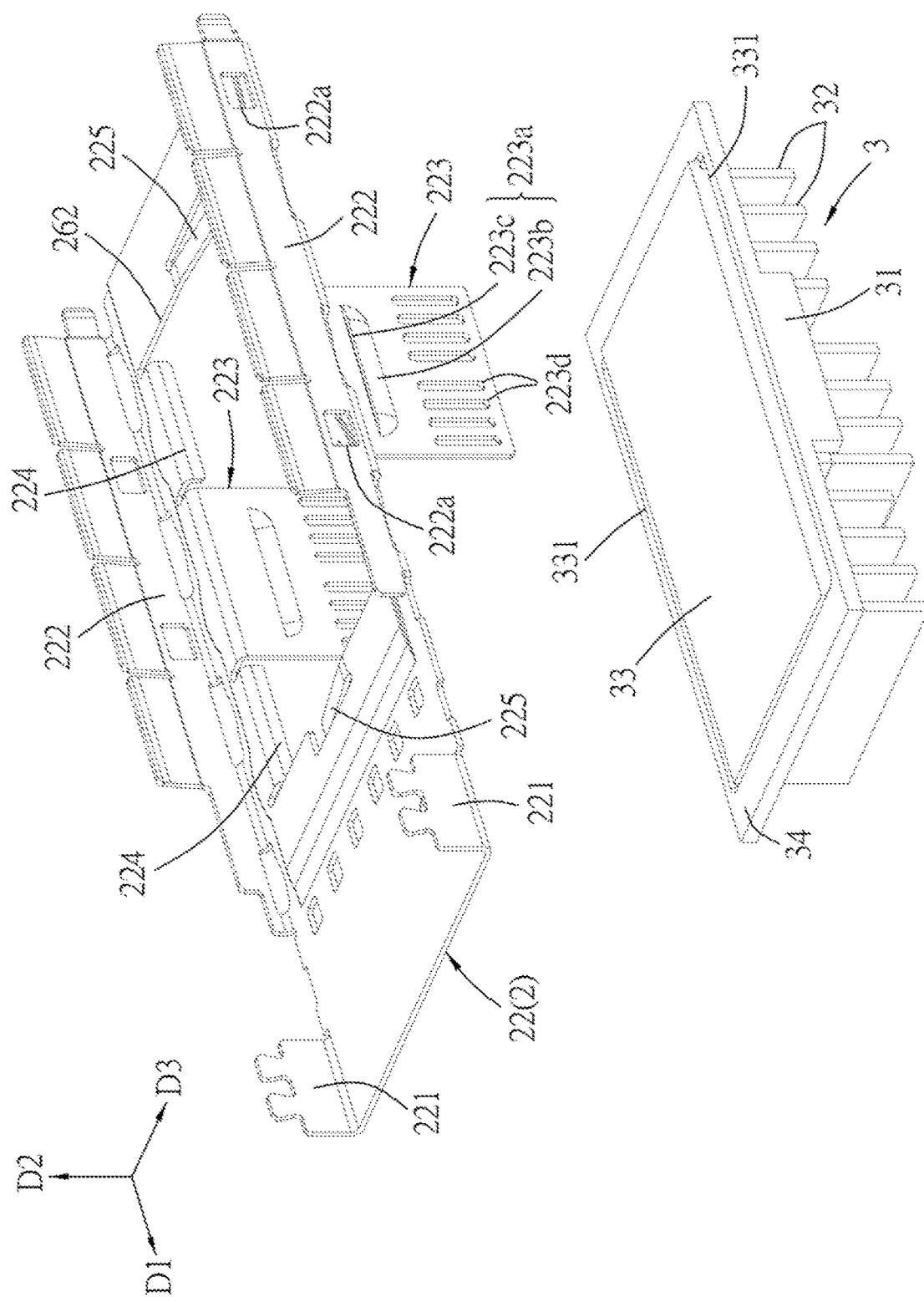
FIG. 5 is a perspective exploded view of a bottom wall of a cage and a lower heat sink of the first embodiment.
Figure 6:
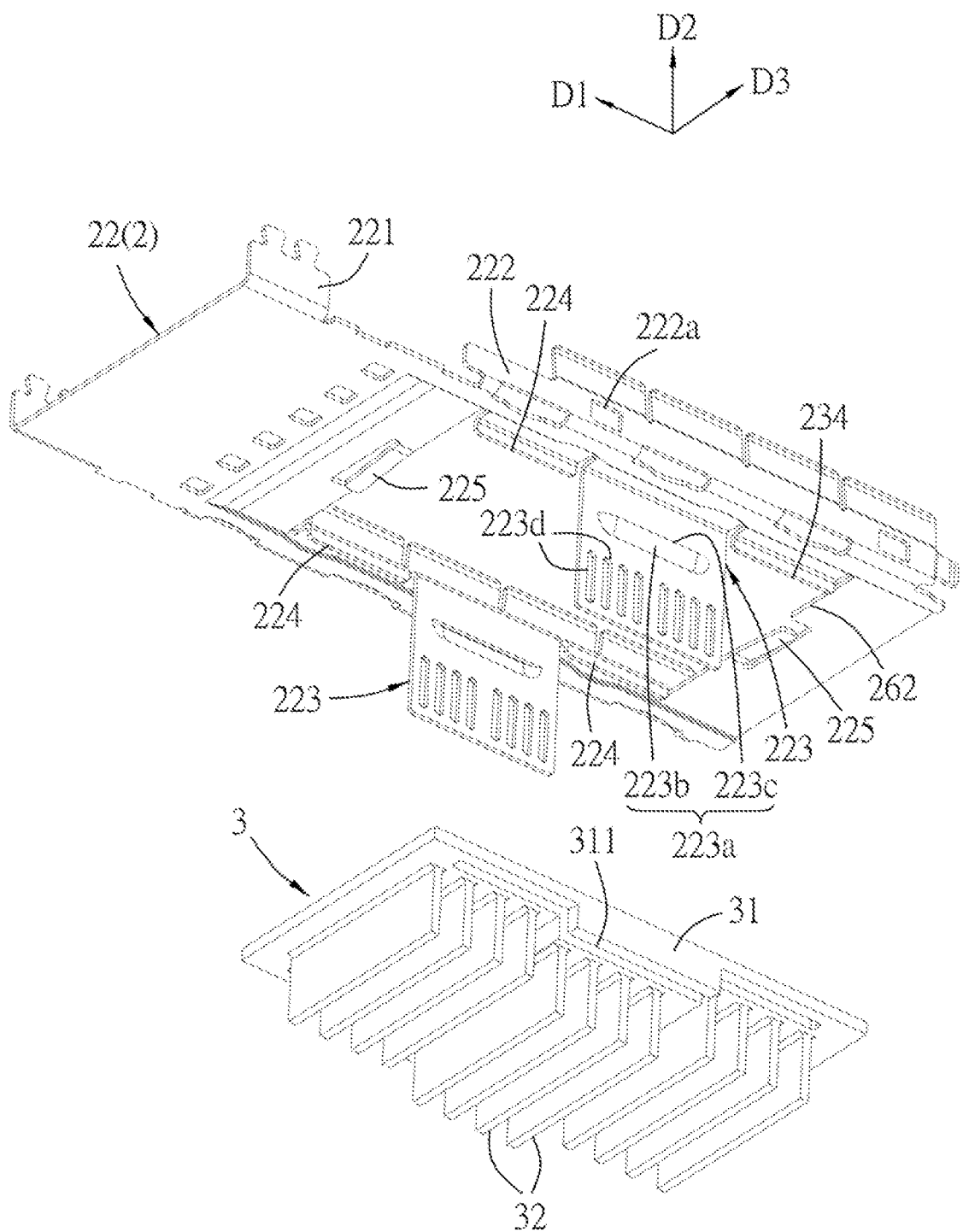
FIG. 6 is a perspective exploded view of the bottom wall of the cage of and the lower heat sink of the first embodiment of FIG. 5 viewed from another angle.
Figure 7:
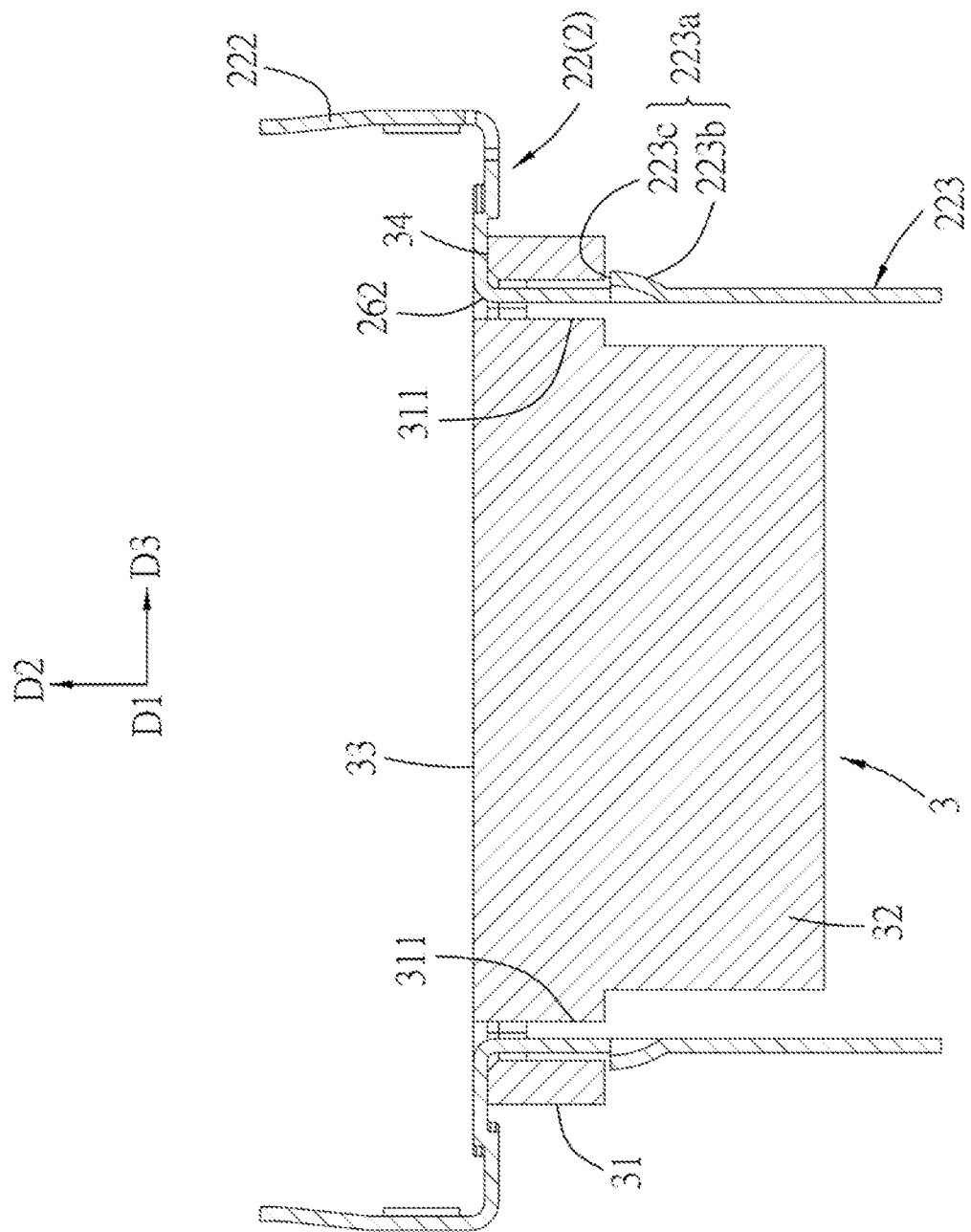
FIG. 7 is a cross sectional view of the bottom wall of the cage and the lower heat sink of the first embodiment.
Figure 8:
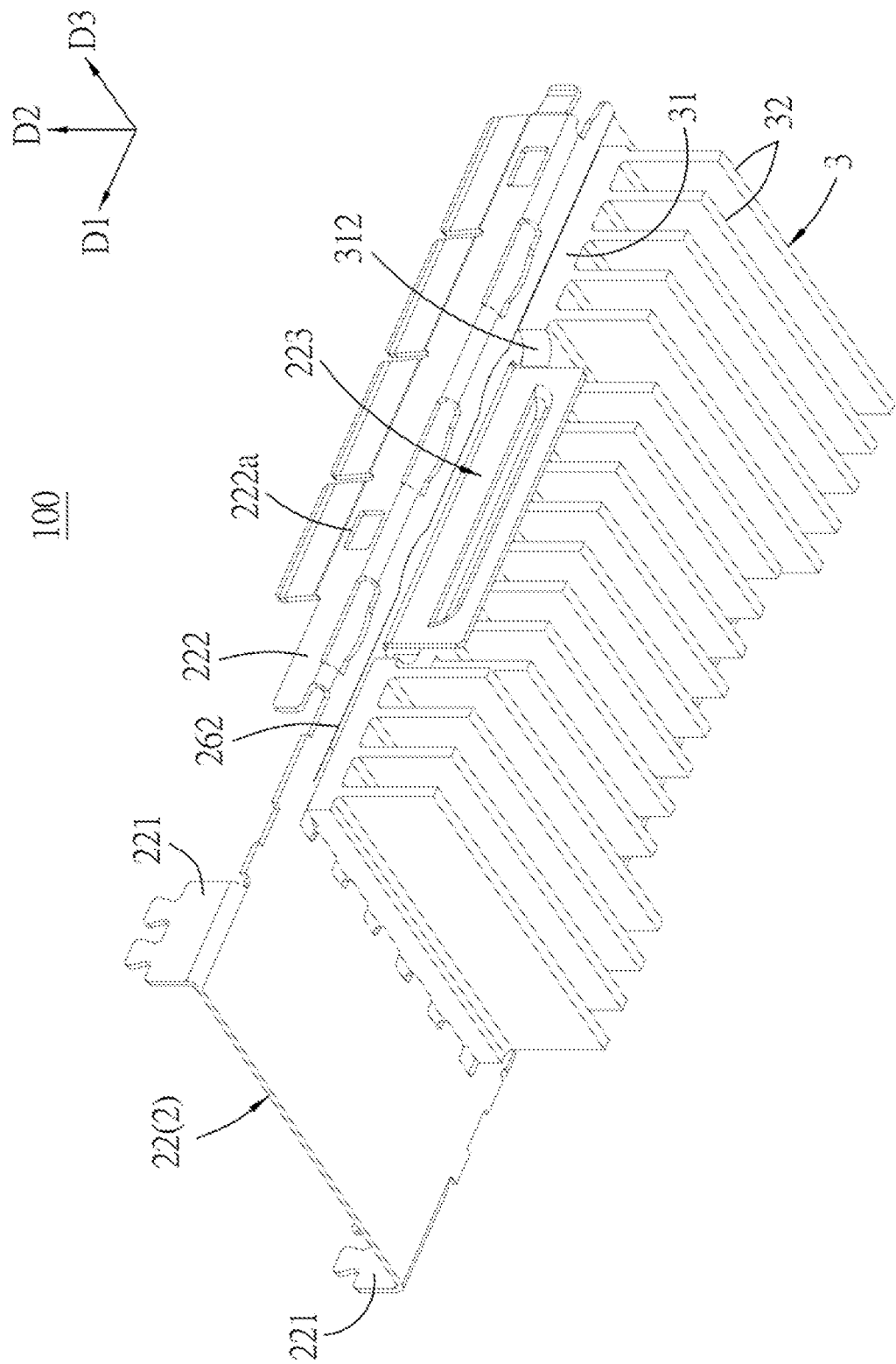
FIG. 8 is a perspective view of a bottom wall of a cage and a lower heat sink of a second embodiment of the connector assembly of the present disclosure.
Figure 9:
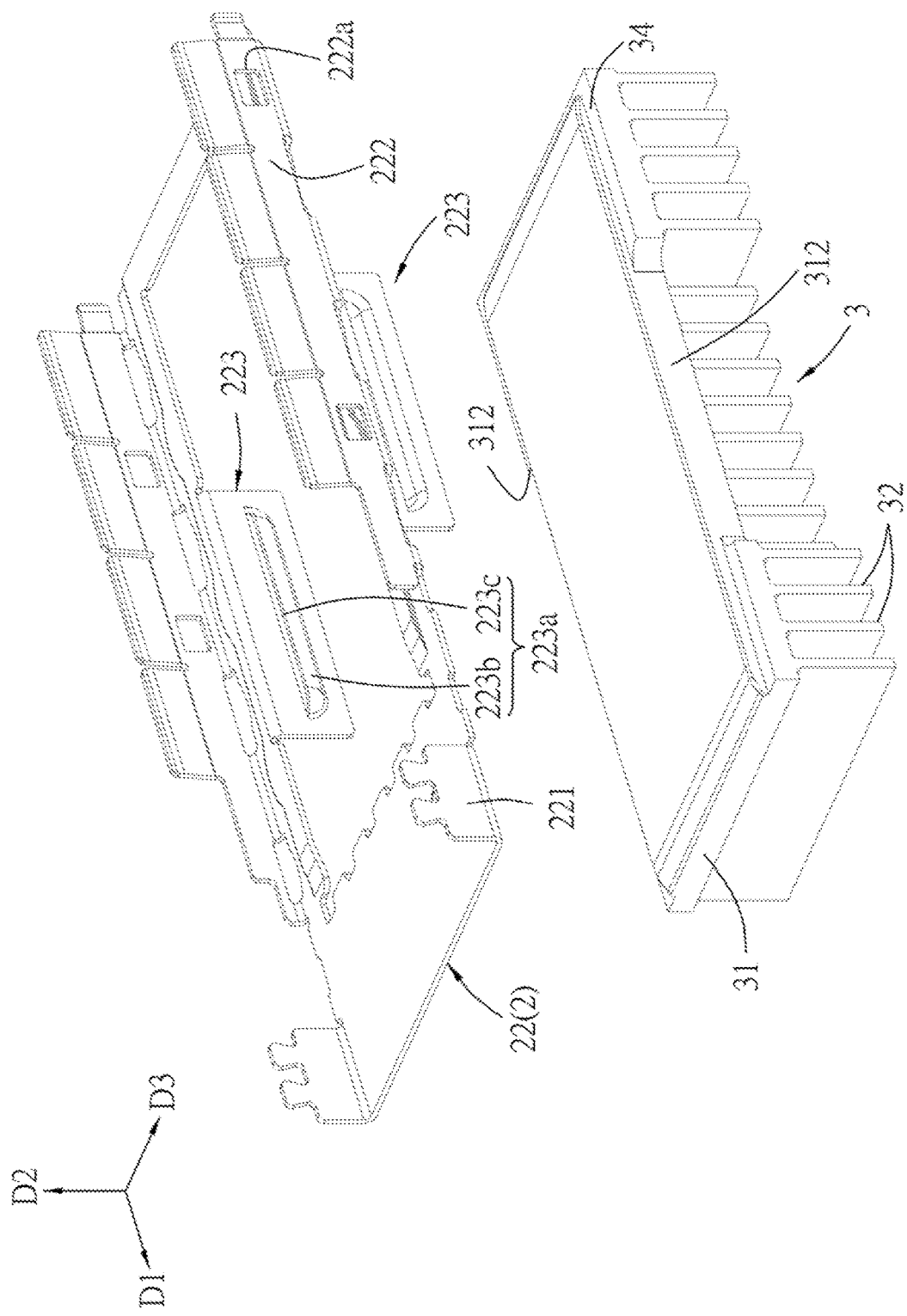
FIG. 9 is a perspective exploded view of the bottom wall of the cage and the lower heat sink of the second embodiment.
Figure 10:
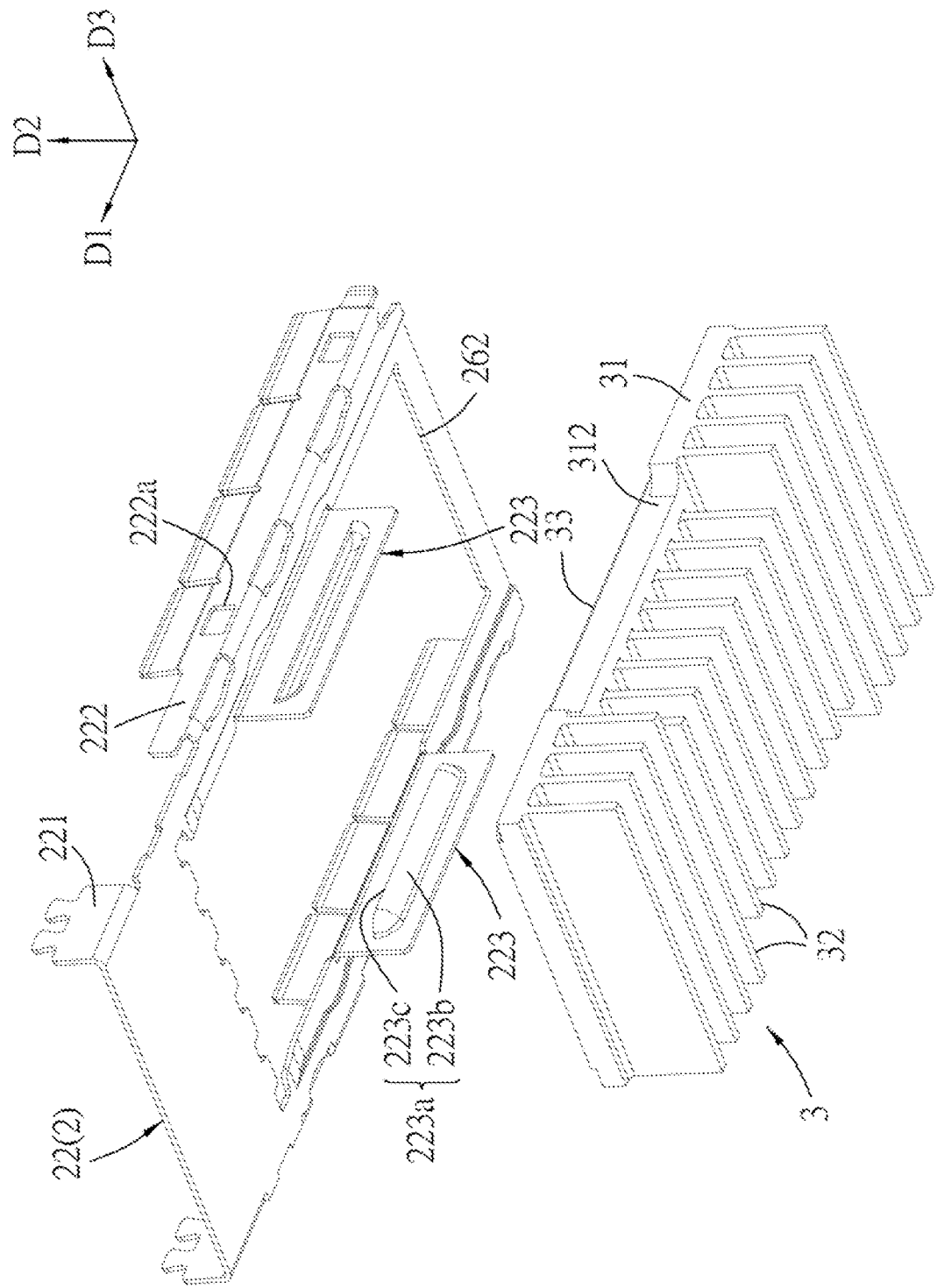
FIG. 10 is a perspective exploded view of the bottom wall of the cage and the lower heat sink of the second embodiment of FIG. 9 viewed from another angle.
Figure 11:
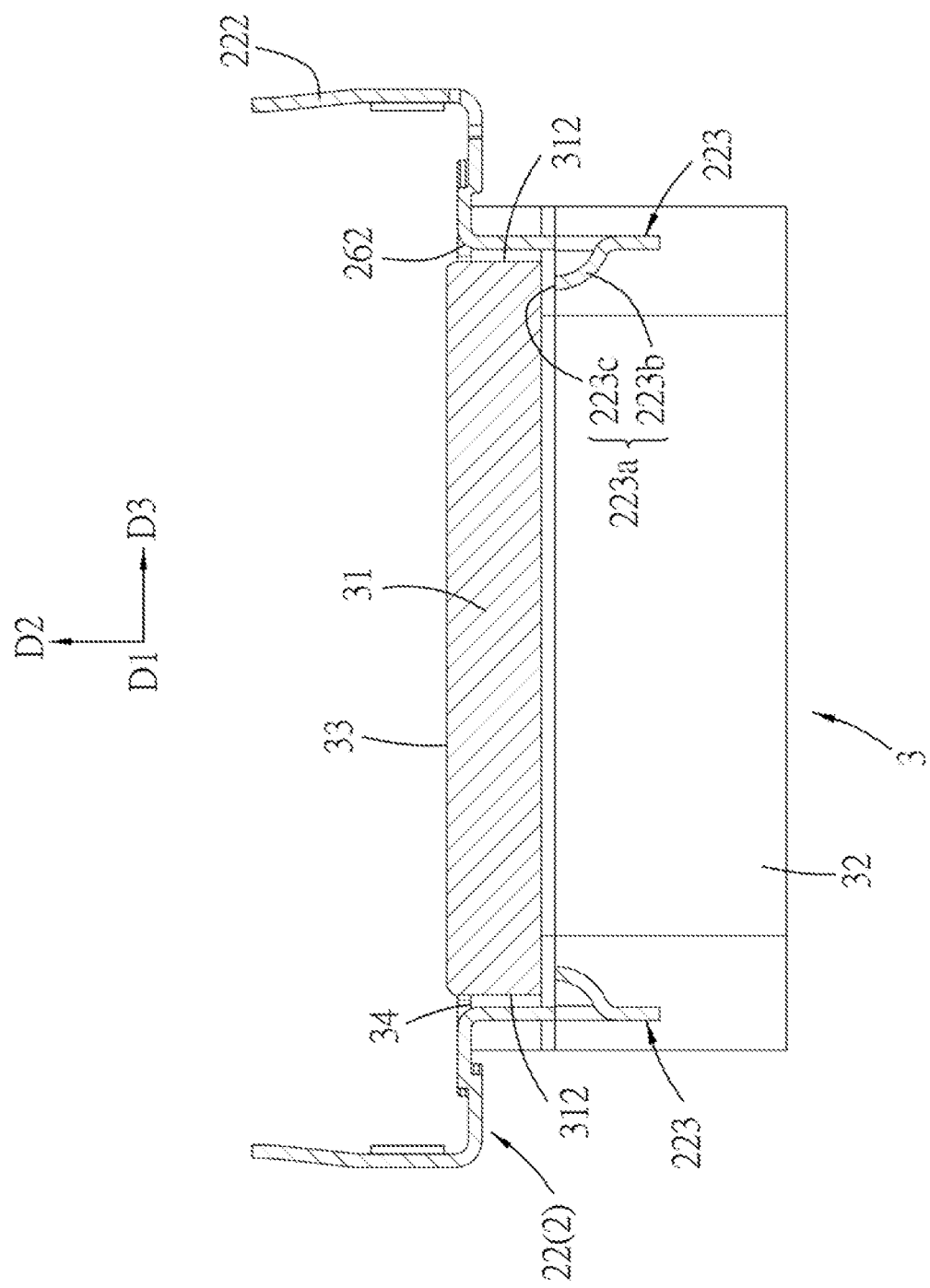
FIG. 11 is a cross sectional view of the bottom wall of the cage and the lower heat sink of the second embodiment.
Figure 12:
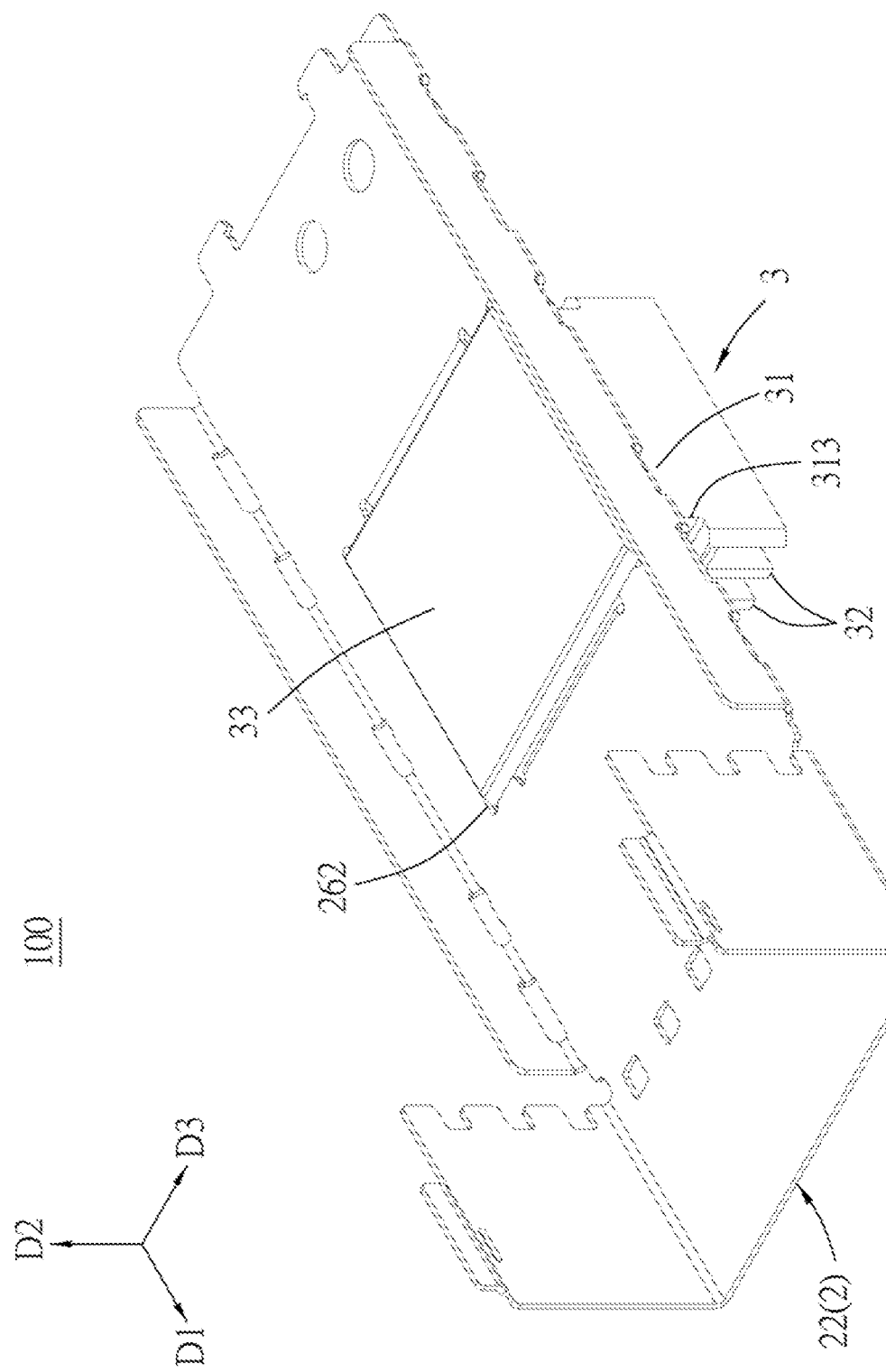
FIG. 12 is a perspective view of a bottom wall of a cage and a lower heat sink of a third embodiment of the connector assembly of the present disclosure.
Figure 13:
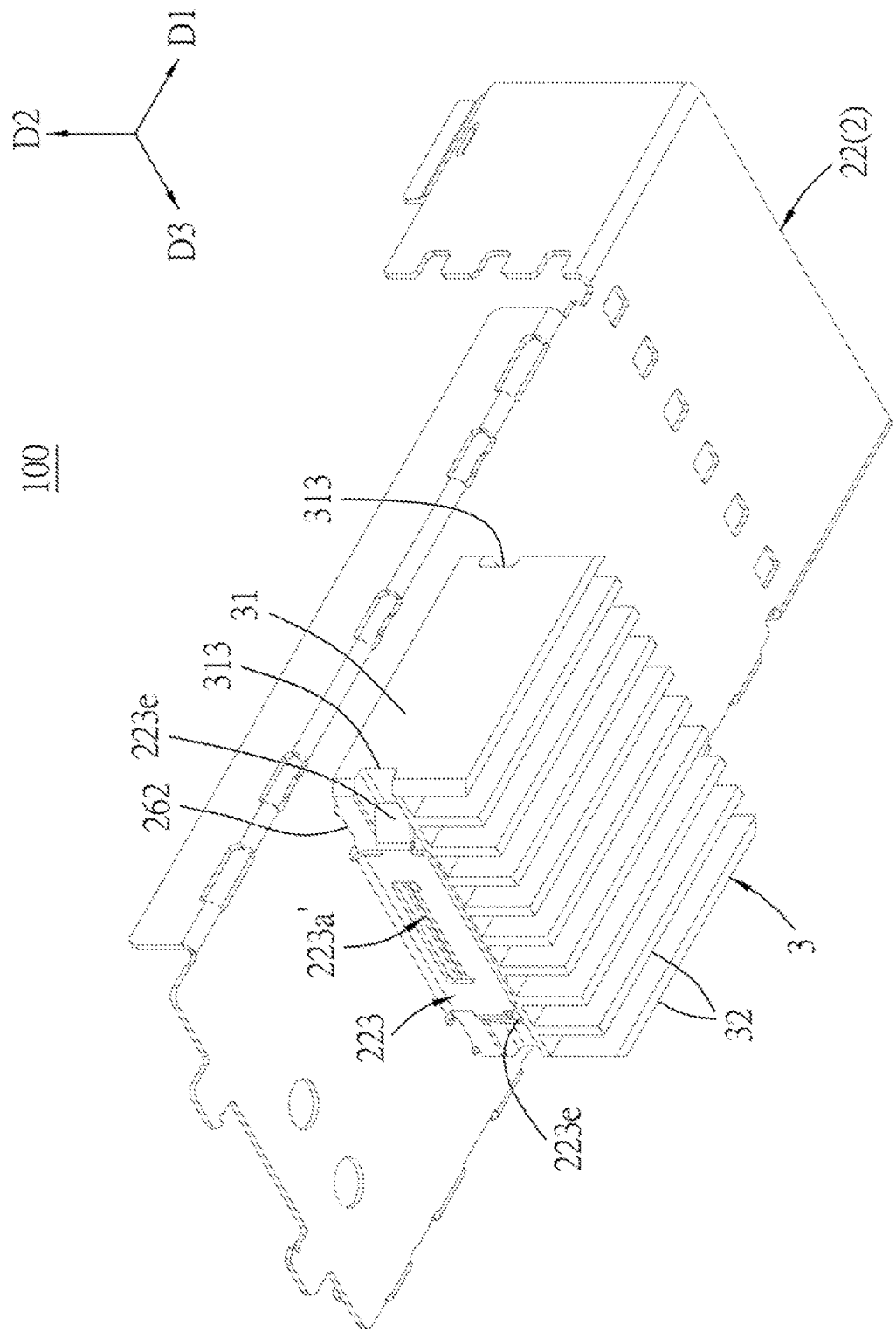
FIG. 13 is a perspective view viewed from an angle different form FIG. 12.
Figure 14:
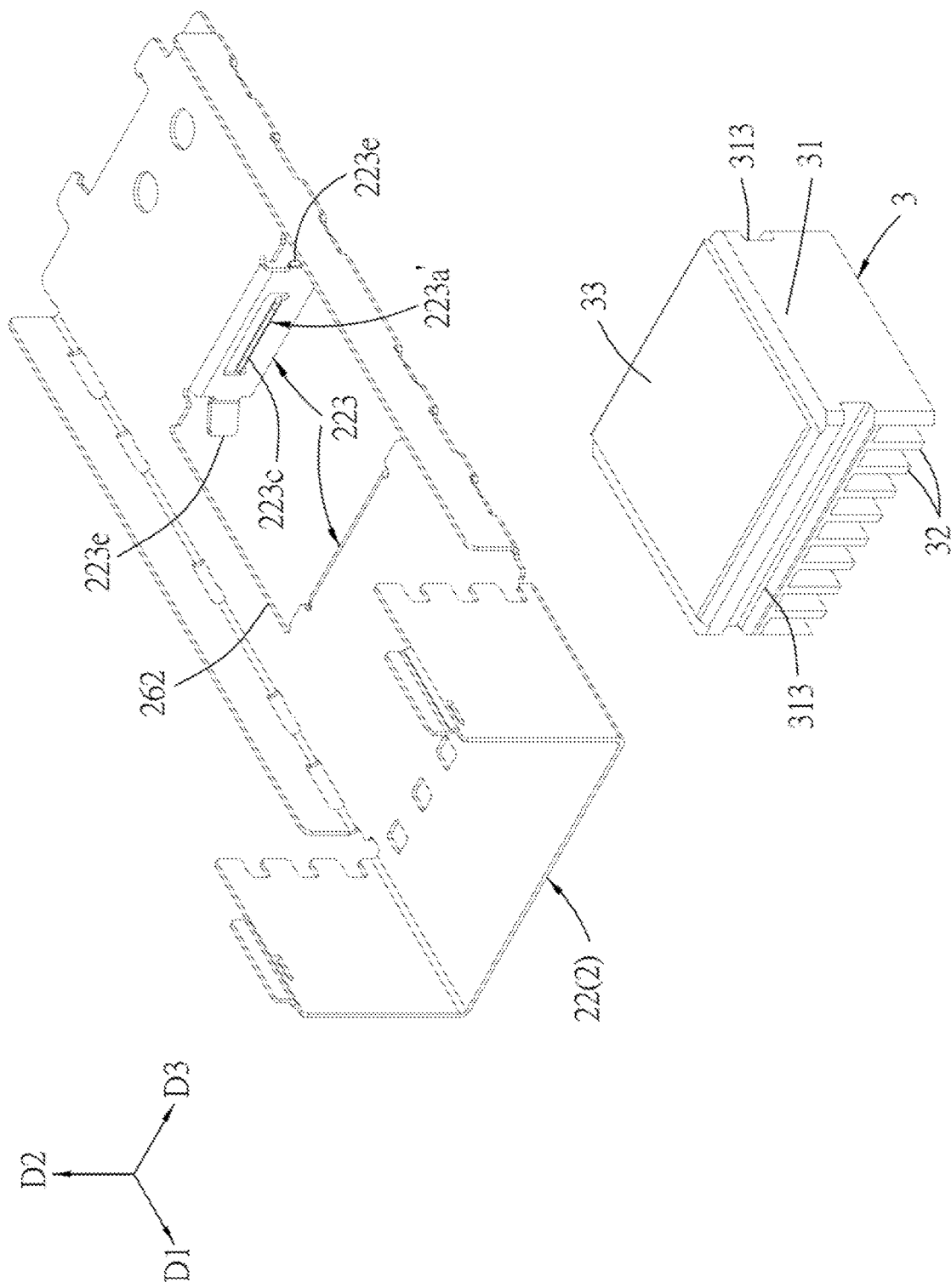
FIG. 14 is a perspective exploded view of FIG. 12.
Figure 15:
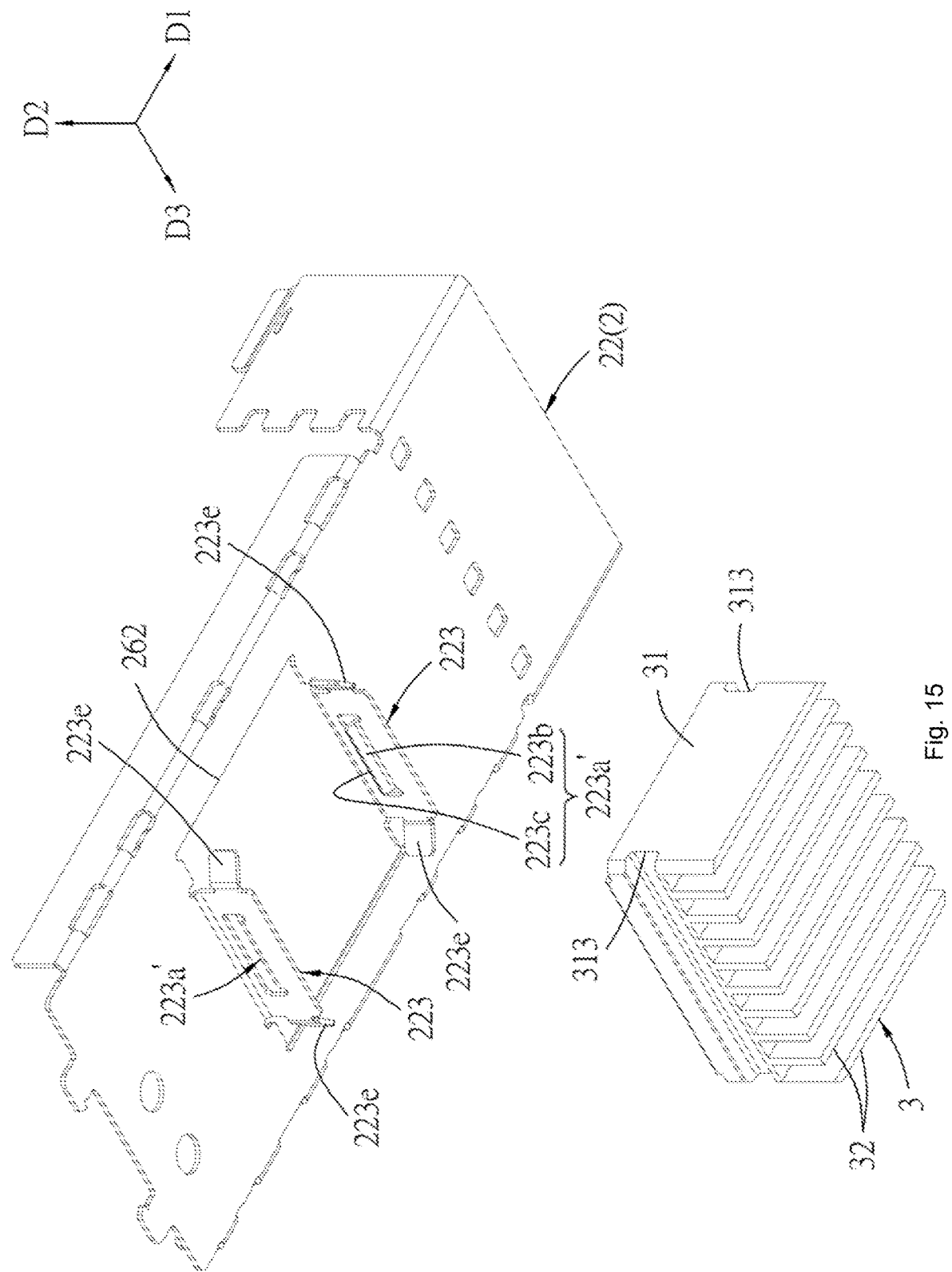
FIG. 15 is a perspective exploded view of FIG. 13.

Before the present disclosure is described in detail, it is noted that the similar components are indicated by the same reference numerals in the following description.

Referring to FIG. 1 to FIG. 4, a first embodiment of a connector assembly 100 of the present disclosure is adapted to be provided on a circuit board 200 and adapted to mate with a pluggable module 300. The pluggable module 300 includes a shell 301, a mating board 302 and a cable 303, the shell 301 includes an insertion portion 301a, the mating board 302 is provided to a tip end of the insertion portion 301a, and the mating board 302 has a plurality of contact fingers 302a thereon, the cable 303 is provided to the shell 301 and is mechanically and electrically connected to the mating board 302. The connector assembly 100 includes a receptacle connector 1, a cage 2, a lower heat sink 3 (a first heat sink), an upper heat sink 4 (a second heat sink) and an elastic clip 5. It is noted that, the receptacle connector 1, the cage 2, the lower heat sink 3, the upper heat sink 4 and the elastic clip 5 may be adjusted in number as desired and may be a stacked or combined configuration, and thus may not be limited to the first embodiment in number.

The receptacle connector 1 (see FIG. 1) is mechanically and electrically provided to the circuit board 200, the receptacle connector 1 has an insulative housing 11 and a plurality of terminals 12, the housing 11 has a mating slot 111, the plurality of terminals 12 are provided in the mating slot 111 and tail portions (not shown) of the plurality of terminals 12 are electrically and mechanically connected to the circuit board 200.

The cage 2 is, for example, a metal material and covers the receptacle connector 1, the cage 2 may be constructed by punching and bending a metal plate by a tool. The cage 2 extends along a front-rear direction D1 (an arrow pointing direction is front and an opposite direction is rear) and has a top wall 21, a bottom wall 22 which is spaced apart from and face the top wall 21 along an up-down direction D2 (an arrow pointing direction is up and an opposite direction is down), two side walls 23 which are spaced apart from and face each other along a left-right direction D3 (an arrow pointing direction is right and an opposite direction is left) and are respectively connected to two sides of the top wall 21 and the bottom wall 22, a rear wall 24 which is positioned at a rear end of the cage 2 and is connected to a rear edge of the top wall 21 and rear edges of the two side walls 23, and a plurality of insertion legs 25 which extend downwardly from the two side walls 23 and are adapted to be fixed in insertion holes 201 on the circuit board 200 and/or be connected to grounding traces. In addition, the cage 2 further has a receiving space 26 which is defined by the top wall 21, the bottom wall 22, the two side walls 23 and the rear wall 24 together and is positioned inside the cage 2, an insertion opening 261 which is positioned at a front end of the cage 2, is communicated to the receiving space 26 and allows the pluggable module 300 to insert therein, a lower window 262 which is formed to the bottom wall 22 and is communicated with the receiving space 26, an upper window 263 which is formed to the top wall 21, extend rearwardly from a location of a front segment of the top wall 21 and is communicated to the receiving space 26, and a bottom opening 264 which is positioned behind the bottom wall 22 and is communicated with the receiving space 26.

In the first embodiment, the top wall 21, the two side walls 23 and the rear wall 24 of the cage 2 are integrally constructed, but the bottom wall 22 of the cage 2 is provided to the two side walls 23 in an assembling manner. A dovetail concave portion 231 is formed at a bottom edge of each side wall 23 close to a front end of each side wall 23, and each side wall 23 is formed with two latching blocks 232 extending outwardly therefrom, the bottom wall 22 is formed with two dovetail convex portions 221 which integrally extend upwardly from the bottom wall 22 and correspondingly cooperate with the two dovetail concave portions 231 of the two side walls 23 and two assembling sheets 222 which are correspondingly assembled to outer sides of the two side walls 23, each assembling sheet 222 is formed with two latching holes 222a which latch with the two latching blocks 232 of the corresponding side wall 23, so that the bottom wall 22 can be assembled to and engaged with the two side walls 23.

Specifically, the receptacle connector 1 is provided to a rear segment of the receiving space 26 via the bottom opening 264 and the receptacle connector 1 is covered by the cage 2, but the present disclosure is not limited thereto. After the pluggable module 300 enters into the cage 2 via the insertion opening 261, the mating board 302 at the tip end of the insertion portion 301a of the pluggable module 300 can insert into the mating slot 111 of the receptacle connector 1 to allow the plurality of contact fingers 302a of the mating board 302 to contact the plurality of terminals 12 in the mating slot 111 of the receptacle connector 1, so that the pluggable module 300 and the receptacle connector 1 of the connector assembly 100 are mate with each other. Moreover, the cage 2 may be provided to a mounting hole 401 of a casing 400 at a front segment of the cage 2 adjacent to the insertion opening 261, a plurality of grounding members 27 are provided at the insertion opening 261 of the cage 2, the plurality of grounding member 27 have a plurality of elastic fingers 271 which extend rearwardly from a position at the insertion opening 261 and are distributed at an outer side of the cage 2 and an inner side of the cage 2, the elastic finger 271 of the plurality of elastic fingers 271 which is positioned at the outer side of the cage 2 is used to contact a part of the casing 400 which is positioned at a circumferential edge of the mounting hole 401, the elastic finger 271 of the plurality of elastic fingers 271 which is positioned at the inner side of the cage 2 is used to contact the pluggable module 300.

Referring to FIG. 3 to FIG. 7, the bottom wall 22 of the cage 2 further has two latching plates 223 which are provided at two sides of the lower window 262 respectively and extend downwardly away from the receiving space 26, the two latching plates 223 may be integrally constructed from the bottom wall 22. The two latching plates 223, for example, may face each other and be arranged side by side along the left-right direction D3 as in the first embodiment, but in other embodiments, also may face each other and be arranged side by side along the front-rear direction D1 (as in a third embodiment). Each latching plate 223 is integrally formed with a latching protrusion 223a, it is noted that, in other embodiments, each latching plate 223 also may be formed with two or more latching protrusions 223a. The latching protrusion 223a has a guiding portion 223b and a latching portion 223c, a protruding amount of the guiding portion 223b from the latching plate 223 gradually increases upwardly as a distance of the guiding portion 223b from the receiving space 26 decreases, the latching portion 223c is positioned to a tip end surface of the guiding portion 223b which is close to the receiving space 26 and is positioned on top. In the first embodiment, the latching protrusions 223a are elongated bulges which are constructed to respectively protrude on outer side surfaces of the two latching plates 223 opposite to each other and extend along the front-rear direction D1, a surface of the guiding portion 223b of the latching protrusion 223a is an arc surface, a protruding amount of the arc surface relative to the latching plate 223 gradually increases. The lower heat sink 3 has a base plate 31, a plurality of heat dissipating fins 32 extending downwardly from an outer side surface (a bottom surface) of the base plate 31 which is opposite to the receiving space 26, and a thermal coupling portion 33 provided to an inner side surface (a top surface) of the base plate 31 which faces the receiving space 26. In the first embodiment, the plurality of heat dissipating fins 32 are arranged side by side along the front-rear direction D1, but in other embodiments, the plurality of heat dissipating fins 32 also may be arranged side by side along the left-right direction D3.

In a process that the lower heat sink 3 is assembled to the cage 2, the base plate 31 push against the guiding portions 223b of the latching protrusions 223a of the two latching plates 223 to make the two latching plates 223 elastically move inwardly along the left-right direction D3, after the base plate 31 passes over the guiding portions 223b of the latching protrusions 223a of the two latching plates 223, a remnant circumferential part 34 of the inner side surface of the base plate 31 except for the thermal coupling portion 33 will be limited by a bottom surface of the bottom wall 22 in position, and the two latching plates 223 elastically restore, and the latching portions 223c of the latching protrusions 223a of the two latching plates 223 latch with the outer side surface of the base plate 31 which is opposite to the receiving space 26, so that the thermal coupling portion 33 passes through the lower window 262 and enters into the receiving space 26. Therefore, with the arc surfaces of the guiding portions 223b of the latching protrusions 223a of the two latching plates 223, the lower heat sink 3 can be guided and smoothly directly pushed in to assemble and latch and fix with the latching portions 223c of the two latching protrusions 223a, and by that the two latching plates 223 are pushed and pulled, the lower heat sink 3 can be rapidly detached. Specifically, in the first embodiment, because the two latching protrusions 223a are formed to the outer side surfaces of the two latching plates 223 which are opposite to each other, if the two latching plates 223 are push inwardly along the left-right direction D3, the latching portions 223c of the latching protrusions 223a of the two latching plates 223 may be unlatched with the outer side surface of the base plate 31, the detaching process is convenient and rapid. Moreover, in combination with referring to FIG. 2, the circuit board 200, for example, may be formed with an avoiding opening 202 which is used to avoid the two latching plates 223 and the plurality of heat dissipating fins 32 of the lower heat sink 3.

In addition, in the first embodiment, the base plate 31 of the lower heat sink 3 is formed with two grooves 311 which allow the two latching plates 223 to pass through respectively and extend along the front-rear direction D1, the latching protrusions 223a of the two latching plates 223 pass through the two grooves 311 respectively, so that the latching portions 223c of the two latching protrusions 223a latch with the outer side surface of the base plate 31, the two grooves 311 and the two latching plates 223 has function of aligning and limiting in position therebetween. Furthermore, the bottom wall 22 of the cage 2 further has a plurality of auxiliary insertion sheets 224 which are adjacent to the two latching plates 223, are provided to two sides of the lower window 262 and are inserted into the two grooves 311, the auxiliary insertion sheets 224 are provided alongside each latching plate 223, the plurality of auxiliary insertion sheets 224 can assist to align with the two grooves 311, guide the lower heat sink 3 to be assembled and assist to hold the lower heat sink 3 after the lower heat sink 3 is assembled. On the other hand, each latching plate 223 is further formed with a plurality of airflow holes 223d. The airflow holes 223d can allow an air to pass through to flow through between the plurality of heat dissipating fins 32 of the lower heat sink 3, thereby promoting heat dissipating efficacy of the lower heat sink 3.

Moreover, in the first embodiment, the bottom wall 22 is further provided with two elastic tabs 225 which press outwardly (downwardly) and elastically against the inner side surface (the top surface) of the base plate 31 of the lower heat sink 3 and are respectively positioned in front of and behind the lower window 262, the two elastic tabs 225 are integrally formed from the bottom wall 22 to protrude outwardly (downwardly), by the two elastic tabs 225 pressing against the lower heat sink 3, stability of the lower heat sink 3 after the lower heat sink 3 is assembled can be increased, and a pushing force in a detaching direction further can be provided in detaching the lower heat sink 3, detaching the lower heat sink 3 is further more convenient and easy. It is noted that, the positions of the two elastic tabs 225 are not limited to in front of and behind the lower window 262, the positions of the two elastic tabs 225 also may be changed to other positions where the two elastic tabs 225 can press against the base plate 31 of the lower heat sink 3.

Referring to FIG. 1 to FIG. 4, the upper heat sink 4 is provided at the upper window 263 of the top wall 21 of the cage 2, the upper heat sink 4 has a base plate 41 provided to the top wall 21, a plurality of heat dissipating fins 42 which are formed upwardly from an outer side surface (a top surface) of the base plate 41 and are arranged side by side along the left-right direction D3, and a thermal coupling portion 43 which is provided to an inner side surface (a bottom surface) of the base plate 41 and enters into the receiving space 26 via the upper window 263. The upper heat sink 4 is assembled to the top wall 21 of the cage 2 by mean of the elastic clip 5 in a manner that the upper heat sink 4 can elastically move relative to the receiving space 26. The elastic clip 5 has two elastic pressing portions 51 which each extend along the left-right direction D3 and press against the base plate 41 of the upper heat sink 4 from above and two assembling portions 52 which extend downwardly from two ends of the two elastic pressing portions 51 respectively and latch with the two side walls 23 of the cage 2 respectively. Specifically, the two side walls 23 respectively positioned at two sides of the cage 2 each is formed with two latching protuberances 233, each assembling portion 52 is formed with two latching apertures 521 which correspondingly latch with the two latching protuberances 233 of the corresponding side wall 23. In addition, the upper heat sink 4 further has two avoiding grooves 44 which are formed on the plurality of heat dissipating fins 32 and are used to avoid the two elastic pressing portions 51 respectively.

When the pluggable module 300 enters into the cage 2 and mates with the receptacle connector 1 of the connector assembly 100, a bottom surface of the insertion portion 301a of the shell 301 of the pluggable module 300 will contact the thermal coupling portion 33 of the lower heat sink 3, a top surface of the insertion portion 301a of the shell 301 of the pluggable module 300 will contact the thermal coupling portion 43 of the upper heat sink 4, furthermore, an acting force which is applied by the elastic clip 5 to press downwardly against the upper heat sink 4 will make the thermal coupling portion 43 of the upper heat sink 4 attach on and abut against the top surface of the insertion portion 301a of the shell 301 of the pluggable module 300, and in turn make the bottom surface of the insertion portion 301a of the shell 301 of the pluggable module 300 downwardly abut against the thermal coupling portion 33 of the lower heat sink 3, so that a contact relationship between the pluggable module 300 and the upper heat sink 4 and the lower heat sink 3 is maintained to ensure heat dissipating performance. Therefore, as the lower heat sink 3 (the first heat sink) and the upper heat sink 4 (the second heat sink) are positioned to extent in to the receiving space 26 of the cage 2, heat dissipating efficacy can be significantly enhanced. In addition, it is noted that, in the first embodiment, the lower heat sink 3 (the first heat sink) and the upper heat sink 4 (the second heat sink) are respectively provided in a lower side and an upper side of the cage 2, but in other embodiments, the first heat sink (the lower heat sink 3), the second heat sink (the upper heat sink 4) and the structures of the cage 2 which correspond to the first heat sink (the lower heat sink 3) and the second heat sink (the upper heat sink 4) also may be provided to other sides of the cage 2. That is to say, here the "lower" heat sink and the "upper" heat sink are only for the reader to easy understand and read, and should not be intended to limit the provision positions of the two heat sinks.

Moreover, in the present embodiment, the top wall 21 of the cage 2 has a stopping sheet 211 which is formed at a rear edge of the upper window 263 and bends downwardly and extends. The insertion portion 301a of the pluggable module 300 further has a stopping surface 301b which corresponds to the stopping sheet 211. When the pluggable module 300 enters into the cage 2 and mates with the receptacle connector 1 of the connector assembly 100, the stopping sheet 211 stops the stopping surface 301b, so that the pluggable module 300 and the connector assembly 100 are positioned relative to each other. Moreover, each side wall 23 of the cage 2 further has a locking tab 234 extending inwardly, the insertion portion 301a further has two locking recesses 301c which are formed at two side surfaces of the insertion portion 301a respectively and correspond to the two locking tabs 234 of the two side walls 23 respectively, when the pluggable module 300 mates with the connector assembly 100, the two locking tab 234 latch in the two locking recesses 301c, so that the pluggable module 300 and the connector assembly 100 are locked with each other.

Referring to FIG. 8 to FIG. 11, a second embodiment of the connector assembly 100 of the present disclosure differs from the first embodiment in that, the latching protrusions 223a are elongated bulges which are constructed at the inner side surfaces of the two latching plates 223 which face each other. In a process that the lower heat sink 3 is assembled to the cage 2, the base plate 31 pushes against the guiding portions 223b of the latching protrusions 223a of the two latching plates 223 to make the two latching plates 223 elastically move outwardly along the left-right direction D3, after the base plate 31 passes over the guiding portions 223b of the latching protrusions 223a of the two latching plates 223, the two latching plates 223 elastically restore, and the latching portions 223c of the latching protrusions 223a of the two latching plates 223 latch with the outer side surface of the base plate 31 which is opposite to the receiving space 26, so that the thermal coupling portion 33 passes through the lower window 262 and enters into the receiving space 26. Specifically, in the second embodiment, because the two latching protrusions 223a are formed to the inner side surfaces of the two latching plates 223 which face each other, if the two latching plates 223 are pushed outwardly along the left-right direction D3, the latching portions 223c of the latching protrusions 223a of the two latching plates 223 are unlatched with the outer side surface of the base plate 31. In addition, the base plate 31 of the lower heat sink 3 is formed with two recessed portions 312 corresponding to the two latching plates 223 respectively, the latching protrusions 223a of the two latching plates 223 pass through the two recessed portions 312 respectively, so that the latching portions 223c of the latching protrusions 223a latch with the outer side surface of the base plate 31, the two recessed portions 312 and the two latching plates 223 has function of aligning and limiting in position therebetween.

Referring to FIG. 12 to FIG. 15, a third embodiment of the connector assembly 100 of the present disclosure differs from the first embodiment in that, the two latching plates 223 face each other and are arranged side by side along the front-rear direction D1. In addition, a front side edge and a rear side edge of the base plate 31 of the lower heat sink 3 are formed with two latching grooves 313 which correspond to the two latching plates 223 respectively and extend along the left-right direction D3, the latching portions 223c of the latching protrusions 223a' of the two latching plates 223 respectively latch with upper edges of the two latching grooves 313 of the base plate 31, the latching protrusions 223a' are elongated protruding sheets respectively constructed at inner sides of the two latching plates 223 which face each other and extend along the left-right direction D3. Moreover, each latching plate 223 further has two lugs 223e integrally formed at two side edges thereof respectively, the two lugs 223e may be slightly bent to enter into the corresponding latching grooves 313, thereby strengthening assembling stability between the lower heat sink 3 and the latching plate 223.

Figure 16:
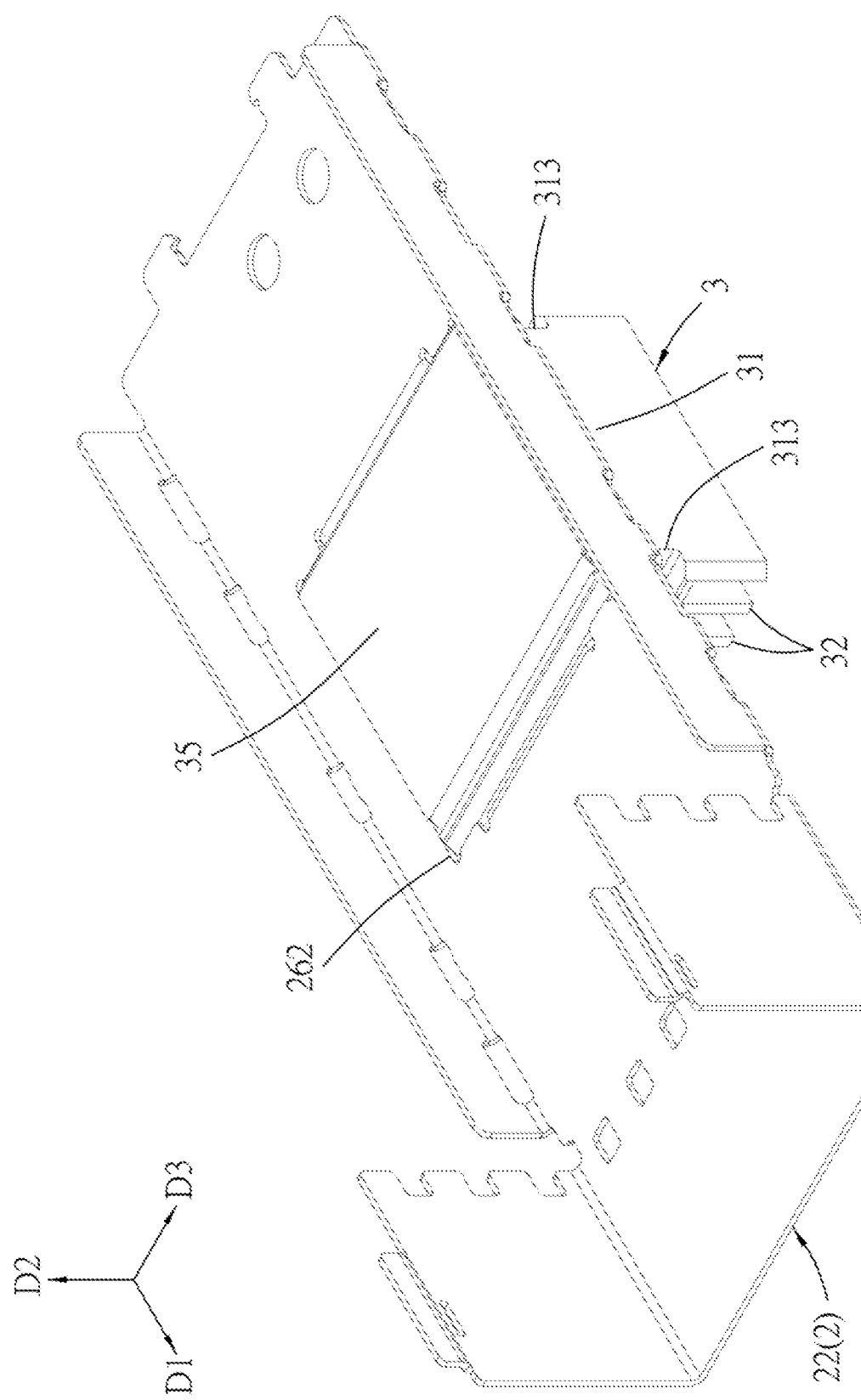
FIG. 16 is a perspective view of a bottom wall of a cage and a lower heat sink of a varied embodiment of the third embodiment of the connector assembly of the present disclosure.
Figure 17:
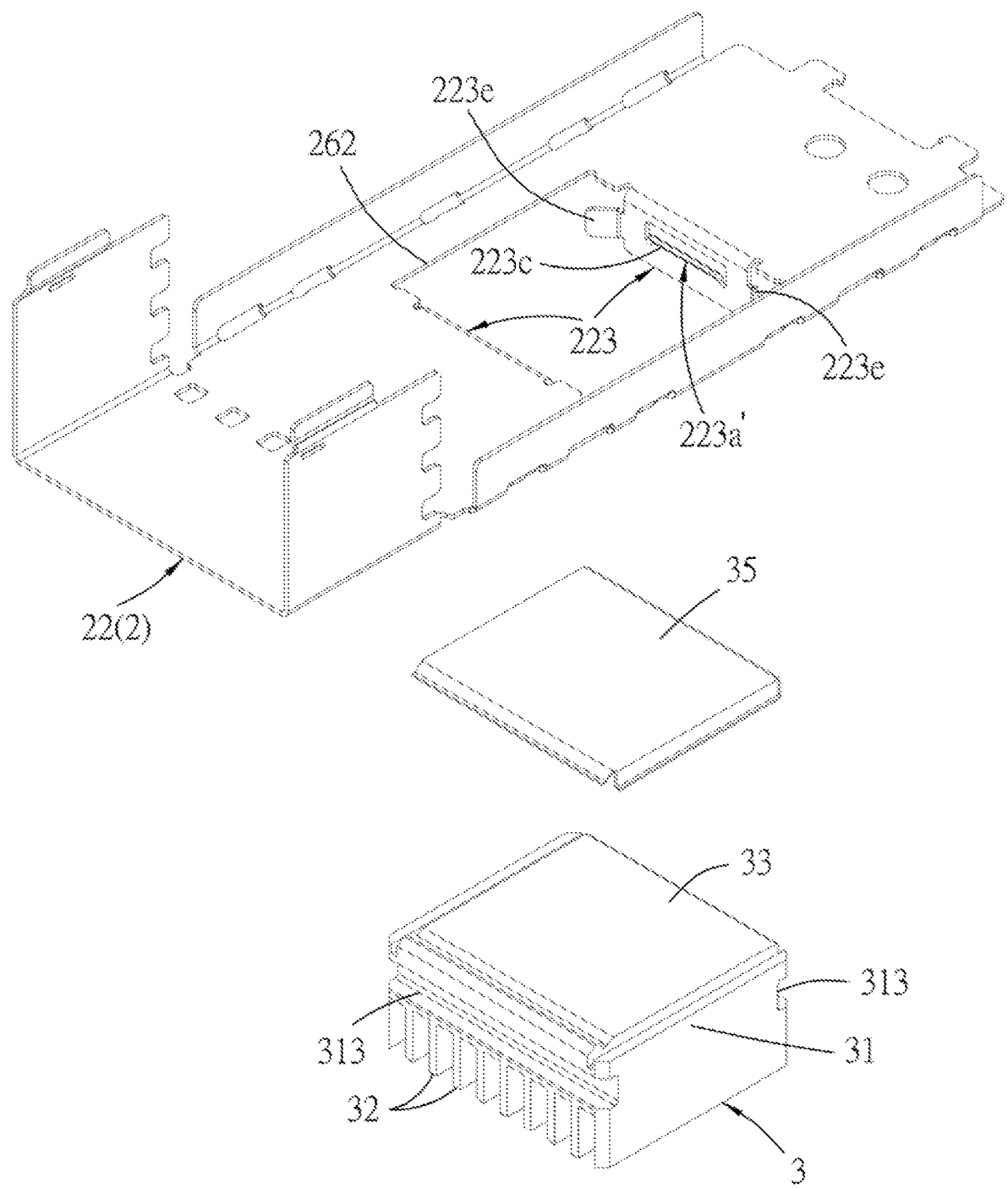
FIG. 17 is a perspective exploded view of FIG. 16.

Referring to FIG. 16 to FIG. 17, in addition, in a varied embodiment of the third embodiment, the thermal coupling portion 33 of the lower heat sink 3 further may be provided with a thermal conductive pad 35, the thermally conductive pad 35 can sufficiently fill the seams or gaps of contact surfaces to reduce a contact thermal resistance between the contact surfaces. The thermally conductive pad 35 may be a thermal interface material, and its material may be selected from, for example, a combination of materials with performances, such as high thermal conductivity, high flexibility, compressibility, insulation, abrasion resistance, etc. al, and for example, can be a combination of a substrate and a phase change material, for example, it can be two or more layers configuration, an outer layer substrate can be a material with thermal conductivity, lubricity, abrasion resistance and tear resistance (such as Teflon), and an inner layer material can be a phase change material. In addition, the thermally conductive pad 35 may also have an electromagnetic wave shielding effect (EMI Shielding) at the same time by changing a combination of materials.

In conclusion, the two latching plates 223 of the cage 2 of the present disclosure are integrally provided with the latching protrusions 223a, each latching protrusion 223a includes a guiding portion 223b and a latching portion 223c, a protruding amount of the guiding portion 223b from the latching plate 223 gradually increases as a distance of the guiding portion 223b from the receiving space 26 decreases, therefore, with the guiding portions 223b of the latching protrusions 223a of the two latching plates 223, the lower heat sink 3 can be guided and smoothly directly pushed in to assemble and latch and fix with the latching portions 223c of the two latching protrusions 223a, and, by that the two latching plates 223 are pushed and pulled, the lower heat sink 3 can be rapidly detached. In addition, by the two elastic tabs 225 pressing against the lower heat sink 3, stability of the lower heat sink 3 after the lower heat sink 3 is assembled can be increased, and, a pushing force in a detaching direction can be further provided in detaching the lower heat sink 3, detaching the lower heat sink 3 is further more convenient and easy. Moreover, the lower heat sink 3 (the first heat sink) and the upper heat sink 4 (the second heat sink) are provided with respect to the receiving space 26 of the cage 2, heat dissipating efficacy is significantly enhanced.

However, the above description is only for the embodiments of the present disclosure, and it is not intended to limit the implementing scope of the present disclosure, and the simple equivalent changes and modifications made according to the claims and the contents of the specification are still included in the scope of the present disclosure.

What is claimed is:

1. A connector assembly, comprising:
   a cage having a wall that defines a receiving space, the wall being formed with a window which is in communication with the receiving space and two latching plates which are provided to two sides of the window and extend away from the receiving space, each latching plate being integrally formed with a latching protrusion, the latching protrusion having a guiding portion and a latching portion, a protruding amount of the guiding portion from the latching plate gradually increasing as a distance from the receiving space decreases, the latching portion being positioned to a tip end surface of the guiding portion which is close to the receiving space; and
   a heat sink having a base plate and a thermal coupling portion provided on an inner side surface of the base plate which faces the receiving space, the latching plates configured so that the base plate presses against the guiding portions of the latching protrusions of the two latching plates to make the two latching plates elastically move during installation, the latching plates configured to engage the base plate with the latching portions when the thermal coupling portion is positioned so as to extend into the receiving space.

2. The connector assembly of claim 1, wherein the latching portions of the latching protrusions of the two latching plates latch with an outer side surface of the base plate which is opposite to the receiving space, the latching protrusions are elongated bulges which are constructed to outer side surfaces of the two latching plates opposite to each other, a surface of the guiding portion of the latching protrusion is an arc surface, and a protruding amount of the arc surface relative to the latching plate gradually increases.

3. The connector assembly of claim 2, wherein the base plate of the heat sink is formed with two grooves which are configured to allow the two latching plates to pass through during installation, the latching protrusions configured to pass through the two grooves respectively so that the latching portions latch with the outer side surface of the base plate.

4. The connector assembly of claim 3, wherein the wall of the cage further has auxiliary insertion sheets which are provided alongside each latching plate and inserted into the two grooves.

5. The connector assembly of claim 1, wherein the latching portions latch with an outer side surface of the base plate which is opposite to the receiving space, the latching protrusions are elongated bulges which are constructed at inner side surfaces of the two latching plates and which face each other, wherein a surface of the guiding portion has an arc surface and the arc surface gradually protrudes an increased amount relative to the latching plate.

6. The connector assembly of claim 5, wherein the base plate of the heat sink is formed with two recessed portions corresponding to the two latching plates, the latching protrusions of the two latching plates being configured, during installation, to pass through the two recessed portions respectively, so that the latching portions of the two latching protrusions latch with the outer side surface of the base plate.

7. The connector assembly of claim 1, wherein the wall is provided with an elastic tab which presses outwardly and elastically against the inner side surface of the base plate of the heat sink.

8. The connector assembly of claim 1, wherein each latching plate is formed with a plurality of airflow holes.

9. The connector assembly of claim 1, wherein the base plate is formed with two latching grooves which correspond to the two latching plates respectively, wherein the latching portions latch with the two latching grooves and the latching protrusions are elongated protruding sheets constructed at inner sides of the two latching plates which face each other.

10. The connector assembly of claim 9, wherein each latching plate further has two lugs integrally formed to two side edges thereof respectively, the two lugs may be bent to enter into the corresponding latching grooves.

11. The connector assembly of claim 10, wherein the heat sink is a first heat sink, the connector assembly further comprises a second heat sink and an elastic clip, the second heat sink is assembled on another wall of the cage facing the wall by means of the elastic clip in a manner that the second heat sink can elastically move relative to the receiving space, the second heat sink having a second thermal coupling portion extending into the receiving space.

12. The connector assembly of claim 11, wherein the second heat sink has a base plate which is assembled on the another wall and is provided with the second thermal coupling portion, the elastic clip has an elastic pressing portion which elastically presses against an outer side surface of the base plate and an assembling portion which extends from the elastic pressing portion and is assembled to the cage.

* * * * *